United States Patent
Tani

(10) Patent No.: US 12,034,464 B2
(45) Date of Patent: Jul. 9, 2024

(54) MULTIPLEXER, FRONT END MODULE, AND COMMUNICATION DEVICE

(71) Applicant: Murata Manufacturing Co., Ltd., Kyoto (JP)

(72) Inventor: Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 321 days.

(21) Appl. No.: 17/471,806

(22) Filed: Sep. 10, 2021

(65) Prior Publication Data

US 2021/0409042 A1     Dec. 30, 2021

Related U.S. Application Data

(63) Continuation of application No. PCT/JP2020/010521, filed on Mar. 11, 2020.

(30) Foreign Application Priority Data

Mar. 13, 2019     (JP) .................... 2019-046269

(51) Int. Cl.
*H04B 1/00* (2006.01)
*H03H 9/64* (2006.01)
(Continued)

(52) U.S. Cl.
CPC ......... *H04B 1/0057* (2013.01); *H03H 9/6433* (2013.01); *H03H 9/72* (2013.01); *H04B 1/18* (2013.01)

(58) Field of Classification Search
CPC .................................................. H04B 1/0057
See application file for complete search history.

(56) References Cited

U.S. PATENT DOCUMENTS

2005/0281210 A1* 12/2005 Makino ............... H03H 9/0576
370/275
2007/0046395 A1   3/2007 Tsutsumi et al.
(Continued)

FOREIGN PATENT DOCUMENTS

JP     2007-060411 A    3/2007
JP     2019-022164 A    2/2019
(Continued)

OTHER PUBLICATIONS

International Search Report for International Application No. PCT/JP2020/010521 dated Jun. 9, 2020.
(Continued)

*Primary Examiner* — Hsinchun Liao
(74) *Attorney, Agent, or Firm* — Pearne & Gordon LLP

(57) ABSTRACT

A multiplexer includes a common terminal, reception output terminals (120 and 130), a filter (20) that is connected between the common terminal and the reception output terminal (120), a filter (30) that is connected between the common terminal and the reception output terminal (130) and has a pass band different from a pass band of the filter (20), and an impedance matching circuit that is arranged between the common terminal and the filter (30). The impedance matching circuit includes a parallel-arm resonator that is connected between a node (N1) on a path connecting the common terminal to the filter (30) and a ground.

13 Claims, 11 Drawing Sheets

(51) Int. Cl.
*H03H 9/72* (2006.01)
*H04B 1/18* (2006.01)

(56) References Cited

U.S. PATENT DOCUMENTS

| | | | |
|---|---|---|---|
| 2014/0266511 A1* | 9/2014 | Turner | G06F 30/327 |
| | | | 716/104 |
| 2017/0251474 A1* | 8/2017 | Khlat | H04B 1/0092 |
| 2017/0302252 A1* | 10/2017 | Hey-Shipton | H04B 1/40 |
| 2018/0109243 A1 | 4/2018 | Takamine | |
| 2018/0254766 A1 | 9/2018 | Shimozono | |
| 2019/0028086 A1 | 1/2019 | Takamine | |
| 2019/0044492 A1 | 2/2019 | Takata | |

FOREIGN PATENT DOCUMENTS

| | | |
|---|---|---|
| JP | 2019-029996 A | 2/2019 |
| WO | 2016/159053 A1 | 10/2016 |
| WO | 2016/208670 A1 | 12/2016 |

OTHER PUBLICATIONS

Written Opinion for International Application No. PCT/JP2020/010521 dated Jun. 9, 2020.

* cited by examiner

MULTIPLEXER, FRONT END MODULE, AND COMMUNICATION DEVICE

CROSS REFERENCE TO RELATED APPLICATIONS

This is a continuation of International Application No. PCT/JP2020/010521 filed on Mar. 11, 2020 which claims priority from Japanese Patent Application No. 2019-046269 filed on Mar. 13, 2019. The contents of these applications are incorporated herein by reference in their entireties.

BACKGROUND

Technical Field

The present disclosure relates to a multiplexer, a front end module including the multiplexer, and a communication device including the multiplexer.

Multiplexers that transmit, receive, or transmit and receive two or more high frequency signals having different frequency bands at the same time with low loss have been required.

In Patent Document 1, a multiplexer with a configuration in which a plurality of filters are connected to a common terminal and an inductor is arranged between one of the plurality of filters and the common terminal is described. Specifically, an impedance of a predetermined pass band of the one of the plurality of filters and an impedance of a predetermined pass band of another filter different from the one of the plurality of filters are in a complex conjugate relationship. Thus, a transmission signal and a reception signal can be transmitted and received at the same time with low loss.

Patent Document 1: International Publication No. 2016/208670

BRIEF SUMMARY

In a multiplexer with a configuration in which a plurality of filters are connected to a common terminal, for example, regarding impedance characteristics of a filter as viewed from the common terminal, the impedance of a band (a pass band of the filter) requires to be set to a reference impedance and, at the same time, the impedance of an attenuation band (a pass band of another filter) requires to be set to a high impedance.

However, in the case where a passive element having a fixed circuit constant, such as a capacitor or an inductor is arranged between a common terminal and a filter as in known multiplexers, the impedance of the filter varies uniformly over a wide band. Therefore, optimization of bandpass characteristics of a filter and optimization of bandpass characteristics of another filter might not be achieved at the same time.

The present disclosure provides a multiplexer that is able to achieve optimization of the impedance of a filter connected to a common terminal and optimization of the impedance of another filter connected to the common terminal at the same time, a front end module including the multiplexer, and a communication device including the multiplexer.

A multiplexer according to an aspect of the present disclosure includes a first common terminal, a first input/output terminal, a second input/output terminal, a first filter that is connected between the first common terminal and the first input/output terminal, a second filter that is connected between the first common terminal and the second input/output terminal and has a pass band different from a pass band of the first filter, and an impedance matching circuit that is arranged between the first common terminal and the second filter. The impedance matching circuit includes an acoustic wave resonator that is connected between a node on a path connecting the first common terminal to the second filter and a ground.

According to the present disclosure, a multiplexer, a front end module, and a communication device that are able to achieve optimization of the impedance of a filter that is connected to a common terminal and optimization of the impedance of another filter that is connected to the common terminal at the same time, can be provided.

DETAILED DESCRIPTION

Hereinafter, embodiments of the present disclosure will be described in detail with reference to drawings. The embodiments described herein illustrate either general or specific examples. Numerical values, shapes, materials, components, and arrangement and modes of connection of the components described in the embodiments are merely examples, and are not intended to limit the present disclosure. Components in the embodiments, except those described in the independent claims, will be explained as optional components.

Furthermore, in the present disclosure, the term "being connected" not only represents being directly connected by a connection terminal and/or a wiring conductor but also includes being electrically connected with a passive element, such as an inductor or a capacitor interposed therebetween.

First Embodiment

[1.1 Configuration of Multiplexer 1, Front End Module 7, and Communication Device 5)

Figure 1:
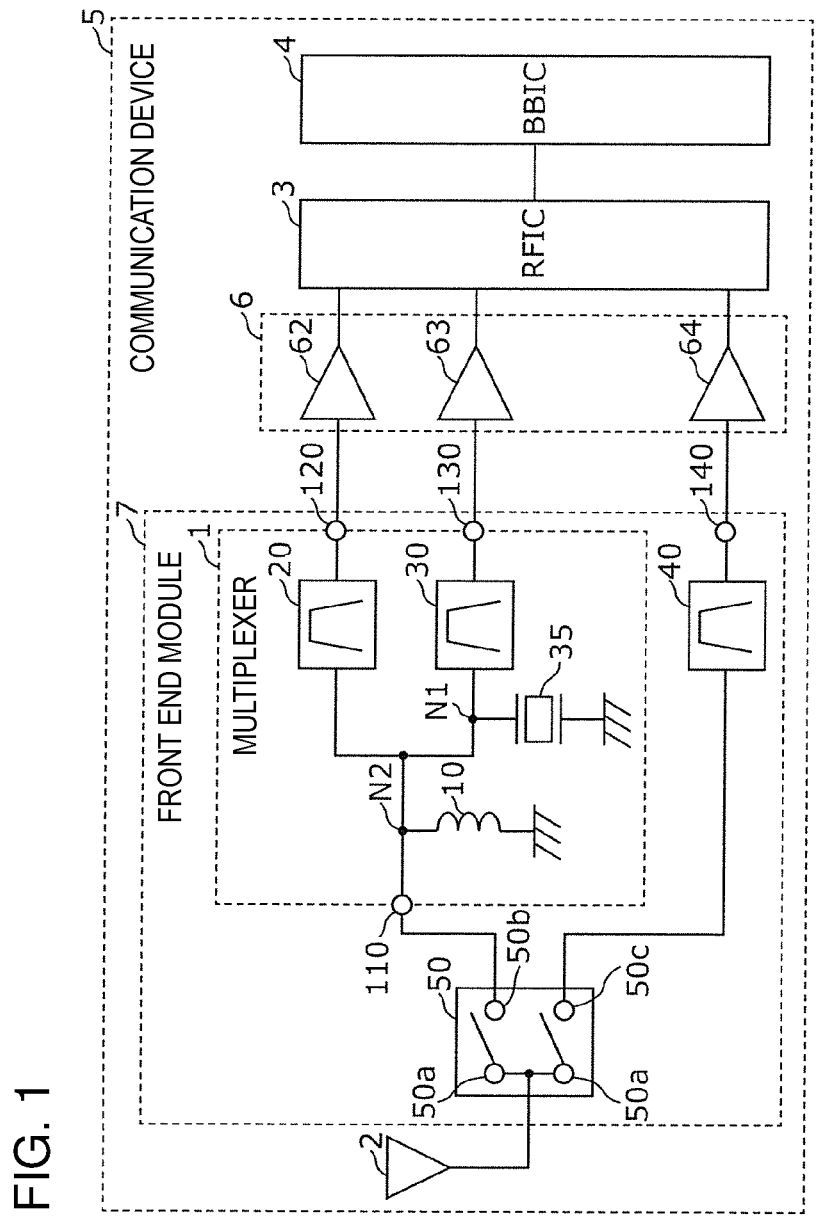
FIG. 1 is a circuit configuration diagram of a multiplexer, a front end module, and a communication device according to a first embodiment.

FIG. 1 is a circuit configuration diagram of a multiplexer 1, a front end module 7, and a communication device 5 according to a first embodiment. As illustrated in FIG. 1, the communication device 5 includes the front end module 7, an antenna 2, a reception amplification circuit 6, an RF signal processing circuit (RFIC) 3, and a baseband signal processing circuit (BBIC) 4.

The RFIC 3 is an RF signal processing circuit that processes a high frequency signal transmitted and received by the antenna 2. Specifically, the RFIC 3 performs signal processing, via down conversion or the like, on a high frequency signal input from the antenna 2 through the front end module 7 and the reception amplification circuit 6 (in this case, a high-frequency reception signal) and outputs a reception signal generated by the signal processing to the BBIC 4. Furthermore, the RFIC 3 may perform signal processing, via up conversion or the like, on a transmission signal input from the BBIC 4 and output a high frequency signal generated by the signal processing (in this case, a high-frequency transmission signal) to the antenna 2 through a transmission circuit included in the communication device 5.

The BBIC 4 is a circuit that performs signal processing using an intermediate frequency band of frequencies lower than a high frequency signal that is transmitted through the front end module 7. For example, a signal that has been processed at the BBIC 4 is used as an image signal for image display or an audio signal for talk through a speaker.

The antenna 2 is an antenna element that is connected to the front end module 7 and emits and receives a high frequency signal.

The reception amplification circuit 6 includes low-noise amplifiers 62, 63, and 64. The low-noise amplifier 62 is arranged between a reception output terminal 120 and the RFIC 3 and amplifies a high-frequency reception signal output from a filter 20. The low-noise amplifier 63 is arranged between a reception output terminal 130 and the RFIC 3 and amplifies a high-frequency reception signal output from a filter 30. The low-noise amplifier 64 is arranged between a reception output terminal 140 and the RFIC 3 and amplifies a high-frequency reception signal output from a filter 40. The reception amplification circuit 6 does not necessarily include three low-noise amplifiers. The reception amplification circuit 6 may include a single low-noise amplifier and a switch for switching connection between the low-noise amplifier and each of the reception output terminals 120, 130, and 140.

The front end module 7 includes the multiplexer 1, the filter 40, a switch 50, and the reception output terminal 140.

The switch 50 is a switch circuit that includes common terminals 50a (second common terminals), a selection terminal 50b (first selection terminal), and a selection terminal 50c (second selection terminal) and is capable of providing connection between the common terminal 50a and the selection terminal 50b and connection between the common terminal 50a and the selection terminal 50c at the same time.

The filter 40 is an example of a third filter. The filter 40 is connected between the selection terminal 50c and the reception output terminal 140 (third input/output terminal) and has a third pass band, which is different from pass bands of the filters 20 and 30.

The multiplexer 1 includes a common terminal 110 (first common terminal), the reception output terminal (first input/output terminal) 120, the reception output terminal (second input/output terminal) 130, the filters 20 and 30, a parallel-arm resonator 35, and an inductor 10.

The common terminal 110 is connected to the selection terminal 50b of the switch 50.

The filter 20 is an example of a first filter. The filter 20 is connected between the common terminal 110 and the reception output terminal 120 and has a first pass band, which is different from the pass bands of the filters 30 and 40.

The filter 30 is an example of a second filter. The filter 30 is connected between the common terminal 110 and the reception output terminal 130 and has a second pass band, which is different from the pass bands of the filters 20 and 40.

The parallel-arm resonator 35 is an example of an impedance matching circuit that is arranged between the common terminal 110 and the filter 30 and is an acoustic wave resonator that is connected between a node N1 on a path connecting the common terminal 110 to the filter 30 and the ground.

The inductor 10 is an example of an impedance matching circuit that is arranged between the common terminal 110 and a connection node for the filters 20 and 30. The inductor 10 is connected between a node N2 on a path connecting the common terminal 110 to the connection node and the ground. The inductor 10 may be arranged in series with the path. Furthermore, the inductor 10 may be a capacitor. Moreover, the inductor 10 is not necessarily provided.

The filters 20, 30, and 40 are, for example, acoustic wave filters using SAW (Surface Acoustic Waves). However, the filters 20, 30, and 40 may be acoustic wave filters using BAW (Bulk Acoustic Waves), LC resonant filters, or dielectric filters.

With the above-described arrangement of the multiplexer 1, an inductive component and a capacitive component that significantly change in the vicinity of a resonant frequency frp and an anti-resonant frequency fap of the parallel-arm resonator 35 may be added to the impedance of the filter 30 as viewed from the common terminal 110. Thus, the direction and amount of shift of impedances of the pass band and the attenuation band of the filter 30 may be made to differ significantly from each other on a Smith chart.

Accordingly, the impedance of the pass band and the impedance the attenuation band of the filter 30 can be optimized separately. Thus, optimization of the impedance of the filter 20 that is connected to the common terminal 110 and optimization of the impedance of the filter 30 that is connected to the common terminal 110 can be achieved at the same time. Consequently, optimization of the bandpass characteristics of the filter 20 and optimization of the bandpass characteristics of the filter 30 can be achieved at the same time.

Furthermore, with the front end module 7 including the multiplexer 1, in the case where a high frequency signal that passes through the filter 20, a high frequency signal that passes through the filter 30, a high frequency signal that passes through the filter 40 are received at the same time, optimization of the bandpass characteristics of the filter 20 and optimization of the bandpass characteristics of the filter 30 can be achieved at the same time.

The multiplexer 1 is a reception demultiplexing circuit that transmits a high-frequency reception signal. However, a multiplexer according to the present disclosure may be a transmission multiplexing circuit that transmits a high-frequency transmission signal. Moreover, a multiplexer according to the present disclosure may include both the reception demultiplexing circuit and the transmission multiplexing circuit.

Furthermore, in the communication device 5 according to this embodiment, the antenna 2, the reception amplification circuit 6, and the BBIC 4 are optional components.

[1.2 Impedance Characteristics of Multiplexer 1]

Figure 2A:
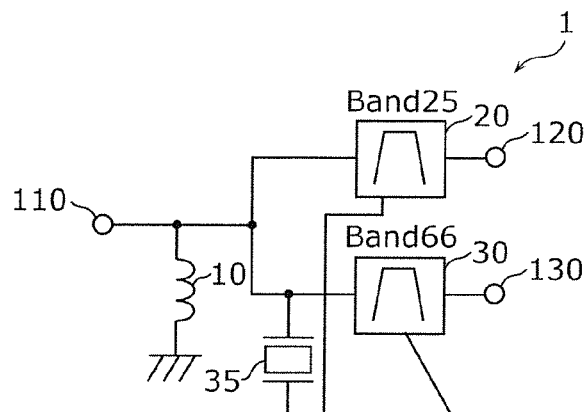
FIG. 2A includes a circuit configuration diagram of the multiplexer according to the first embodiment and FIG. 2B includes a graph indicating impedance characteristics of a parallel-arm resonator.
Figure 2B:
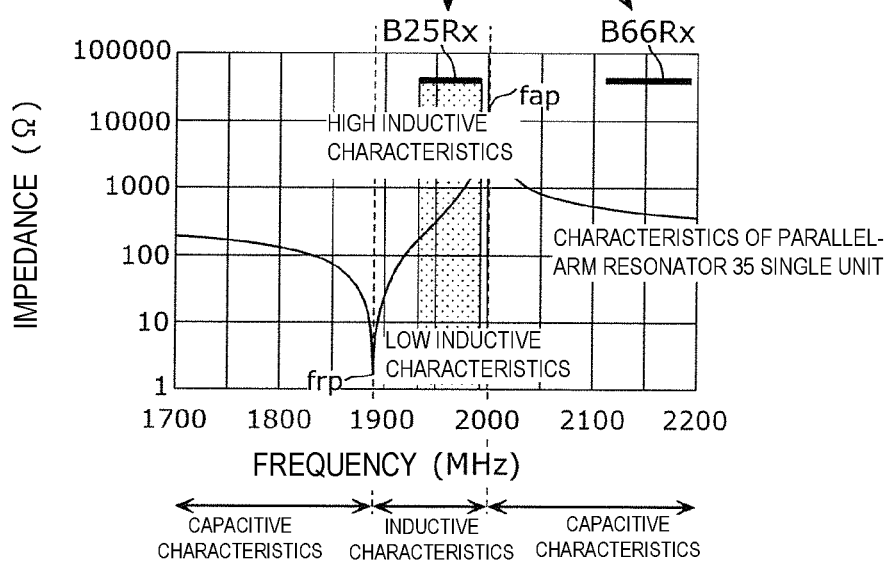

FIG. 2A includes a circuit configuration diagram of the multiplexer 1 according to the first embodiment and FIG. 2B includes a graph indicating impedance characteristics of a parallel-arm resonator. As illustrated in FIG. 2A, the filter 20 is, for example, a filter in which Band 25 (reception band: 1930 MHz to 1995 MHz) of LTE (Long Term Evolution) is used as a first pass band, and the filter 30 is, for example, a filter in which Band 66 (reception band: 2110 MHz to 2200 MHz) of LTE is used as a second pass band. In this case, the first pass band of the filter 20 is located on a frequency side lower than the second pass band of the filter 30. With the arrangement described above, the multiplexer 1 is capable of transmitting a high-frequency reception signal of Band 25 and a high-frequency reception signal of Band 66 at the same time.

As illustrated in FIG. 2B, the parallel-arm resonator 35 is an acoustic wave resonator and thus has a resonant frequency frp of the minimum impedance and an anti-resonant frequency fap of the maximum impedance. The resonant frequency frp is lower than the anti-resonant frequency fap. In a frequency range lower than the resonant frequency frp and a frequency range higher than the anti-resonant frequency fap, the impedance of the parallel-arm resonator 35 exhibits capacitive characteristics. In contrast, in a frequency range higher than the resonant frequency frp and lower than the anti-resonant frequency fap, the impedance of the parallel-arm resonator 35 exhibits inductive characteristics. Furthermore, in the frequency range exhibiting inductive characteristics, higher inductive characteristics are obtained at a frequency closer to the anti-resonant frequency fap, and lower inductive characteristics are obtained at a frequency closer to the resonant frequency frp.

In the multiplexer 1 according to this embodiment, as illustrated in FIG. 2B, the relationship between the frequency range from the resonant frequency frp to the anti-resonant frequency fap of the parallel-arm resonator 35 and the first pass band of the filter 20 (in FIG. 2B, B25Rx) is such that the frequency range from the resonant frequency frp to the anti-resonant frequency fap of the parallel-arm resonator 35 includes the first pass band of the filter 20.

Figure 3A:
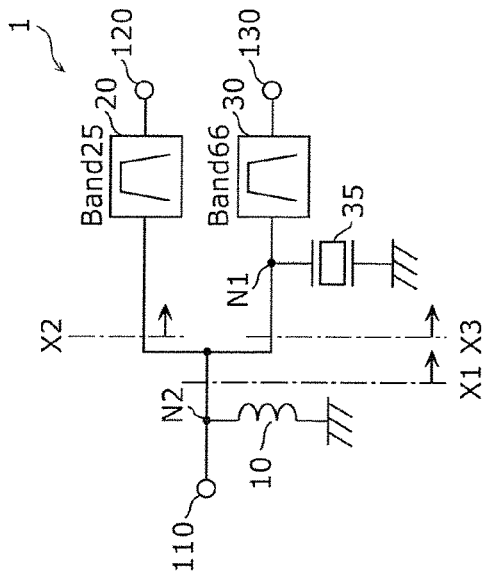
FIG. 3A includes a circuit configuration diagram of the multiplexer according to the first embodiment and FIGS. 3B and 3C include Smith charts indicating impedance characteristics of filters.
Figure 3B:
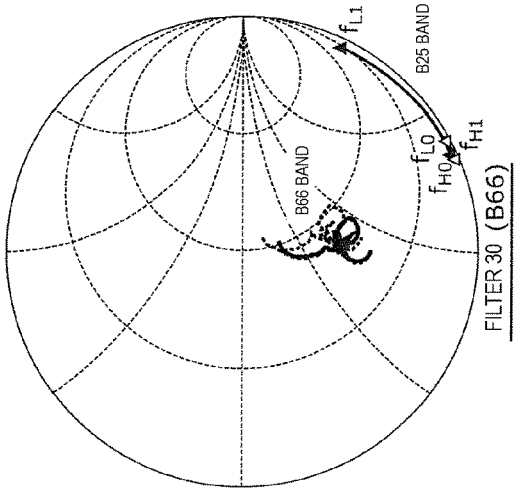
Figure 3C:
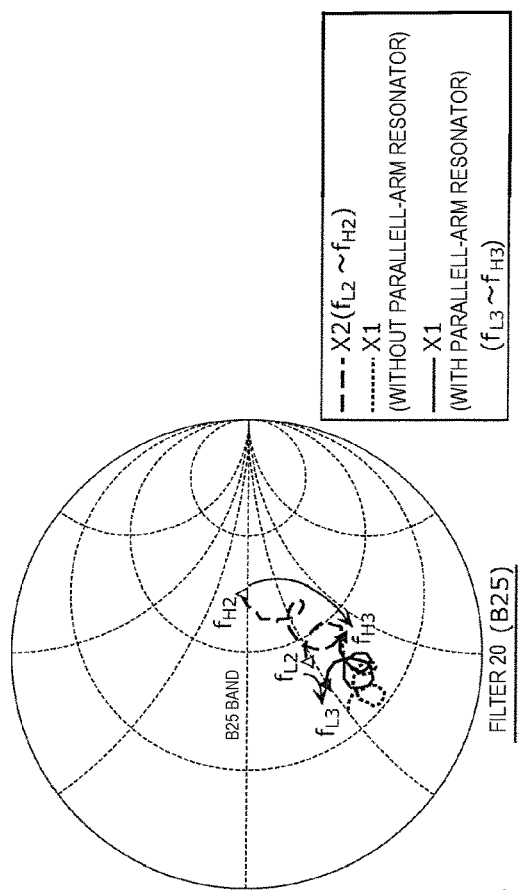

FIG. 3A includes a circuit configuration diagram of the multiplexer 1 according to the first embodiment and FIGS. 3B and 3C include Smith charts indicating impedance characteristics of the filters 20 and 30. As illustrated in FIG. 3A, a node on a path between the node N1 to which the parallel-arm resonator 35 is connected and the node N2 to which the inductor 10 is connected is represented by a node X3, a node on a path between the connection node for the filters 20 and 30 and an input end of the filter 20 is represented by a node X2, and a node on a path between the connection node for the filters 20 and 30 and the node N2 is represented by a node X1. Furthermore, in the Smith chart illustrated in FIG. 3B, only the impedance of the second pass band of the filter 30 (vicinity of a reference impedance: in FIG. 3B, indicated as B66 band) and the impedance of a predetermined attenuation band of the filter 30 (the first pass band of the filter 20) (vicinity of the outer circumference in the fourth quadrant: in FIG. 3B, indicated as B25 band) are illustrated, and illustration of impedances of other bands is omitted. Furthermore, in the Smith chart illustrated in FIG. 3C, only the impedance of the first pass band of the filter 20 (vicinity of a reference impedance: in FIG. 3C, indicated as B25 band) is illustrated, and illustration of impedances of other bands is omitted.

In FIG. 3B, the impedance of the filter 30 as viewed from the node X3 in the case where the parallel-arm resonator 35 is added (and the filter 20 is not connected) (solid line) and the impedance of the filter 30 as viewed from the node X3 in the case where the parallel-arm resonator 35 is not added (broken line) are indicated.

As illustrated in FIG. 2B, the relationship between the frequency range from the resonant frequency frp to the anti-resonant frequency fap of the parallel-arm resonator 35 and the first pass band of the filter 20 is such that the frequency range from the resonant frequency frp to the anti-resonant frequency fap of the parallel-arm resonator 35 includes the first pass band of the filter 20. That is, the first pass band of the filter 20 is included in an inductive region of the parallel-arm resonator 35. Furthermore, the second pass band of the filter 30 is included in a capacitive region of the parallel-arm resonator 35. Accordingly, as illustrated in FIG. 3B, by adding the capacitive impedance of the parallel-arm resonator 35 in parallel, the impedance of the second pass band of the filter 30 as viewed from the node X3 in the case where the parallel-arm resonator 35 is added is shifted in a clockwise direction along a constant conductance circle on the admittance chart.

In contrast, by adding the inductive impedance of the parallel-arm resonator 35 in parallel, the impedance of the attenuation band of the filter 30 (the first pass band) as viewed from the node X3 in the case where the parallel-arm resonator 35 is added is shifted in an anticlockwise direction along the constant conductance circle on the admittance chart. More specifically, regarding the impedance characteristics of the filter 30 as viewed from the node X3, a low inductive component of the parallel-arm resonator 35 is added in parallel in a lower frequency end of the first pass band (B25 band), and a high inductive component of the parallel-arm resonator 35 is added in a higher frequency end of the first pass band (B25 band). Thus, the impedance of the lower frequency end of the first pass band (B25 band) is significantly shifted in the anticlockwise direction along the constant conductance circle on the admittance chart ($f_{L0} \rightarrow f_{L1}$), and the impedance of the higher frequency end of the attenuation band is slightly shifted in the anticlockwise direction along the constant conductance circle on the admittance chart ($f_{H0} \rightarrow f_{H1}$).

Accordingly, regarding the impedance characteristics of the filter 30 as viewed from the node X3, by adding the parallel-arm resonator 35, the impedance of the first pass band (B25 band) can be shifted towards a higher impedance side without necessarily shifting the impedance of the second pass band (B66 band) towards the higher impedance side.

As a result, regarding the impedance characteristics of the filter 30 as viewed from the node X3 in the case where the parallel-arm resonator 35 is added, the impedance of the lower frequency end ($f_{L1}$) of the first pass band (B25 band) exhibits a low capacitance (high reactance) and the impedance of the higher frequency end ($f_{H1}$) of the first pass band (B25 band) exhibits a high capacitance (low reactance).

In contrast, as illustrated in FIG. 3C, regarding the impedance characteristics of the filter 20 single unit as viewed from the node X2, the impedance of the first pass band (in FIG. 3C, indicated as B25 band) (from the lower frequency end $f_{L2}$ to the higher frequency end $f_{H2}$) is located in the vicinity of the reference impedance. However, the impedance of the first pass band of the filter 20 single unit as viewed from the node X2 spreads widely over the lower frequency end ($f_{L2}$) to the higher frequency end ($f_{H2}$).

Meanwhile, as illustrated in FIG. 3C, regarding the impedance characteristics of the filter 20 as viewed from the node X1, by adding a low capacitance derived from the parallel-arm resonator 35 in parallel, the impedance of the lower frequency end of the first pass band is slightly shifted in the clockwise direction along the constant conductance circle on the admittance chart ($f_{L2} \rightarrow f_{L3}$). In contrast, by adding a high capacitance derived from the parallel-arm resonator 35 in parallel, the impedance of the higher frequency end of the first pass band is significantly shifted in the clockwise direction along the constant conductance circle on the admittance chart ($f_{H2} \rightarrow f_{H3}$). As a result, regarding the impedance characteristics of the filter 20 as viewed from the node X1, the degree of concentration of a spiral of the first pass band (B25 band) can be improved.

Figure 4A:
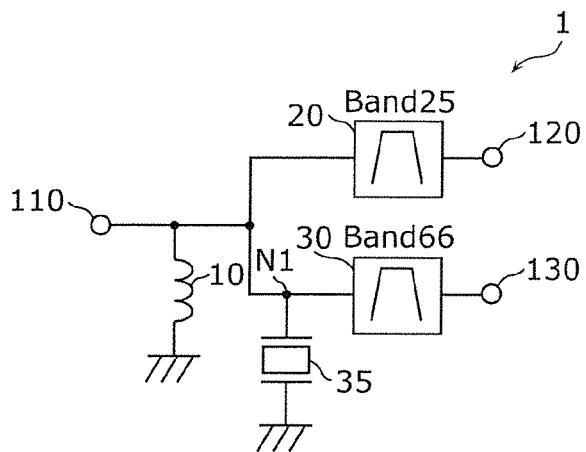
FIG. 4A includes a circuit configuration diagram of the multiplexer according to the first embodiment and FIG. 4B includes a graph indicating bandpass characteristics of a first filter.
Figure 4B:
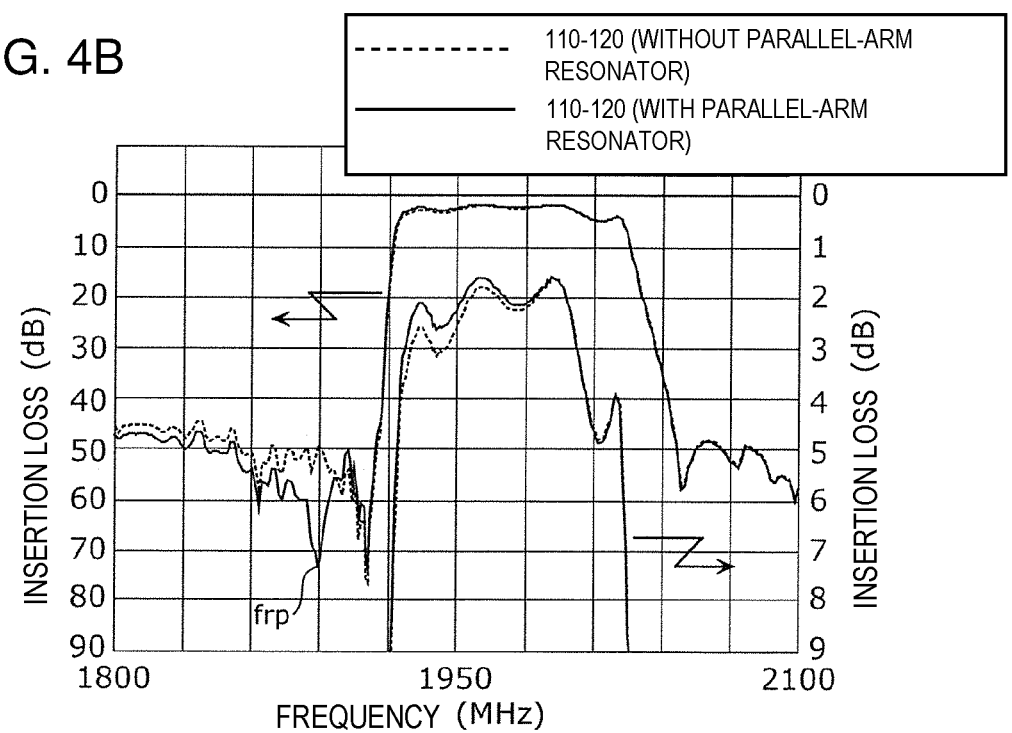

FIG. 4A includes a circuit configuration diagram of the multiplexer 1 according to the first embodiment and FIG. 4B includes a graph indicating bandpass characteristics of the filter 20. In FIG. 4B, the bandpass characteristics of the filter 20 before matching loss is removed in the case where the parallel-arm resonator 35 is added to the node N1 and the bandpass characteristics of the filter 20 before matching loss is removed in the case where the parallel-arm resonator 35 is not added to the node N1 are illustrated. As illustrated in FIG. 4B, the ripple and insertion loss of the first pass band of the filter 20 in the case where the parallel-arm resonator 35 is added to the node N1 are improved compared to the filter 20 in the case where the parallel-arm resonator 35 is not added to the node N1. Furthermore, an attenuation pole corresponding to the resonant frequency frp of the parallel-arm resonator 35 is formed in the attenuation band on the frequency side lower than the first pass band, and the attenuation characteristics on the frequency side lower than the first pass band are improved.

As described above, by adding the parallel-arm resonator 35 to the node N1, the attenuation band of the filter 30 (the first pass band) is shifted towards the higher impedance side. Thus, the attenuation characteristics of the filter 30 can be improved, and the bandpass characteristics (ripple) of the first pass band of the filter 20 can also be improved. That is, the impedances of the pass band and the attenuation band of the filter 30 can be optimized separately. Thus, optimization of the impedance of the filter 20 that is connected to the common terminal 110 and optimization of the impedance of the filter 30 that is connected to the common terminal 110 can be achieved at the same time. Therefore, optimization of the bandpass characteristics (ripple) of the filter 20 and optimization of the bandpass characteristics (attenuation characteristics) of the filter 30 can be achieved at the same time.

As illustrated in FIG. 2B, the multiplexer 1 according to this embodiment is based on the condition that the relationship between the frequency range from the resonant frequency frp to the anti-resonant frequency fap of the parallel-arm resonator 35 and the first pass band of the filter 20 is such that the frequency range from the resonant frequency frp to the anti-resonant frequency fap of the parallel-arm resonator 35 includes the first pass band of the filter 20. However, the multiplexer 1 according to this embodiment does not necessarily satisfy the condition mentioned above. Instead of the relationship mentioned above, the relationship between the frequency range from the resonant frequency frp to the anti-resonant frequency fap of the parallel-arm resonator 35 and the first pass band of the filter 20 may be such that the frequency range from the resonant frequency frp to the anti-resonant frequency fap of the parallel-arm resonator 35 at least partially overlaps with the first pass band of the filter 20. Alternatively, the anti-resonant frequency fap of the parallel-arm resonator 35 may be included in the first pass band of the filter 20.

Even in the case where the frequency range from the resonant frequency frp to the anti-resonant frequency fap of the parallel-arm resonator 35 at least partially overlaps with the first pass band of the filter 20 or the anti-resonant frequency fap of the parallel-arm resonator 35 is included in the first pass band of the filter 20, regarding the impedance characteristics of the filter 30 as viewed from the common terminal 110, a capacitive component with slight variations may be added to the impedance of the pass band (the second pass band) and an inductive component and a capacitive component that vary significantly in the vicinity of the resonant frequency frp and in the vicinity of the anti-resonant frequency fap of the parallel-arm resonator 35 may be added to the impedance of the attenuation band (the first bandpass characteristics). Thus, the direction and amount of shift of the impedances of the pass band and the attenuation band of the filter 30 may be made to differ significantly from each other on the Smith chart. Consequently, optimization of the impedance of the filter 20 that is connected to the common terminal 110 and optimization of the impedance of the filter 30 that is connected to the common terminal 110 can be achieved at the same time.

[1.3 Configuration of Multiplexer 1A According to Modification]

Figure 5A:
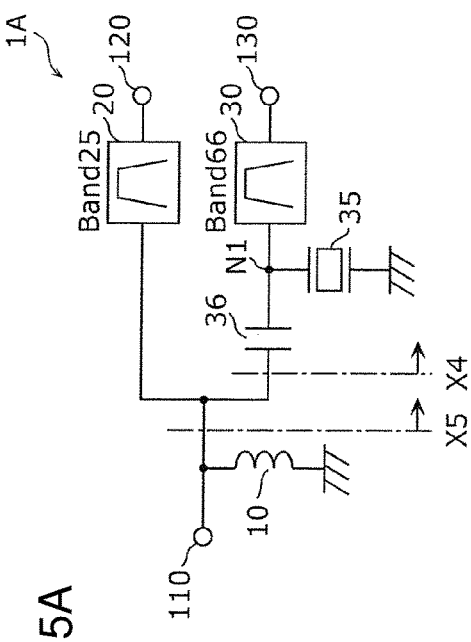
FIG. 5A includes a circuit configuration diagram of a multiplexer according to a modification of the first embodiment and FIGS. 5B and 5C include Smith charts indicating impedance characteristics of filters.
Figure 5C:
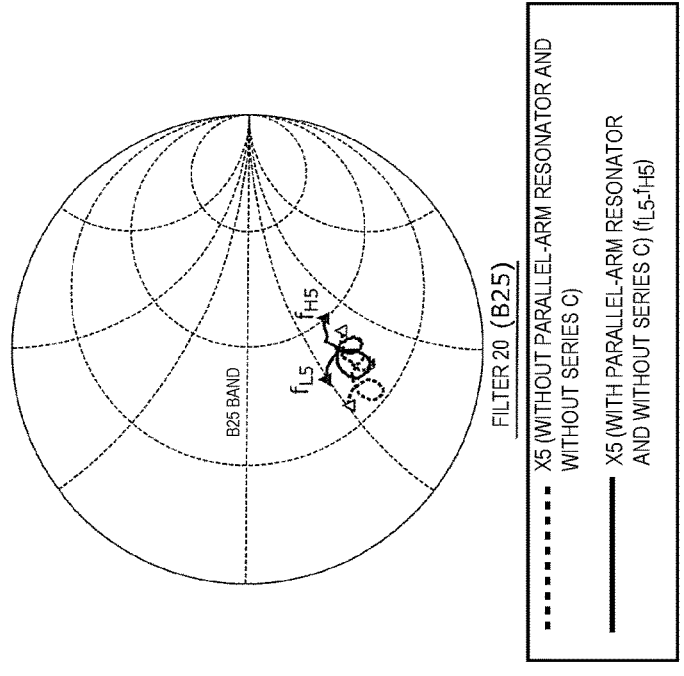
Figure 5B:
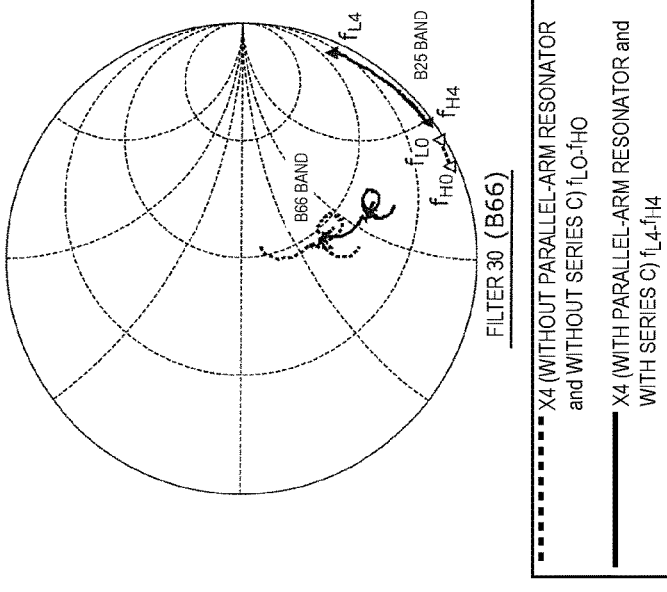

FIG. 5A includes a circuit configuration diagram of a multiplexer 1A according to a modification of the first embodiment and FIGS. 5B and 5C include Smith charts indicating impedance characteristics of the filters 20 and 30.

As illustrated in FIG. 5A, the multiplexer 1A includes the common terminal 110, the reception output terminals 120 and 130, the filters 20 and 30, the parallel-arm resonator 35, the inductor 10, and a capacitor 36. The multiplexer 1A according to this modification is different from the multiplexer 1 according to the first embodiment in that the capacitor 36 is added. The multiplexer 1A according to this modification will be described below by focusing on differences from the multiplexer 1 according to the first embodiment and explanation for the same features as those of the multiplexer 1 according to the first embodiment will be omitted.

The capacitor 36 is included in an impedance matching circuit that is arranged between the common terminal 110 and the filter 30 and is arranged in series between the common terminal 110 and the node N1.

[1.4 Impedance Characteristics of Multiplexer 1A According to Modification]

In the Smith chart illustrated in FIG. 5B, only the impedance of the second pass band of the filter 30 (vicinity of the reference impedance: in FIG. 5B, indicated as B66 band) and the impedance of a predetermined attenuation band of the filter 30 (the first pass band of the filter 20) (vicinity of the outer circumference in the fourth quadrant: in FIG. 5B, indicated as B25 band) are illustrated, and illustration of impedances of other bands is omitted. Furthermore, in the Smith chart illustrated in FIG. 5C, only the impedance of the first pass band of the filter 20 (vicinity of the reference impedance: in FIG. 5C, indicated as B25 band) is illustrated, and illustration of impedances of other bands is omitted.

In the multiplexer 1 according to the first embodiment, regarding the impedance characteristics of the filter 30 as viewed from the node X3, in the case where the impedance of the attenuation band located in the fourth quadrant (B25 band) is shifted in the anticlockwise direction along the constant conductance circuit on the admittance chart by the parallel-arm resonator 35, the shift occurs towards the higher impedance side. However, reflection characteristics are not improved (the degree of sticking to the outer circumference of the Smith chart decreases).

In contrast, in the multiplexer 1A according to this modification, regarding the impedance characteristics of the filter 30 as viewed from the node X3, by adding the capacitor 36 in series, the impedance of the attenuation band located in the fourth quadrant (B25 band) is shifted in the anticlockwise direction along the constant resistance circle on the Smith chart ($f_{L1}$ in FIG. 3B→$f_{L4}$ in FIG. 5B, $f_{H1}$ in FIG. 3B→$f_{H4}$ in FIG. 5B). Thus, the reflection characteristics of the attenuation band (B25 band) are improved (the degree of sticking to the outer circumference of the Smith chart increases).

Figure 6A:
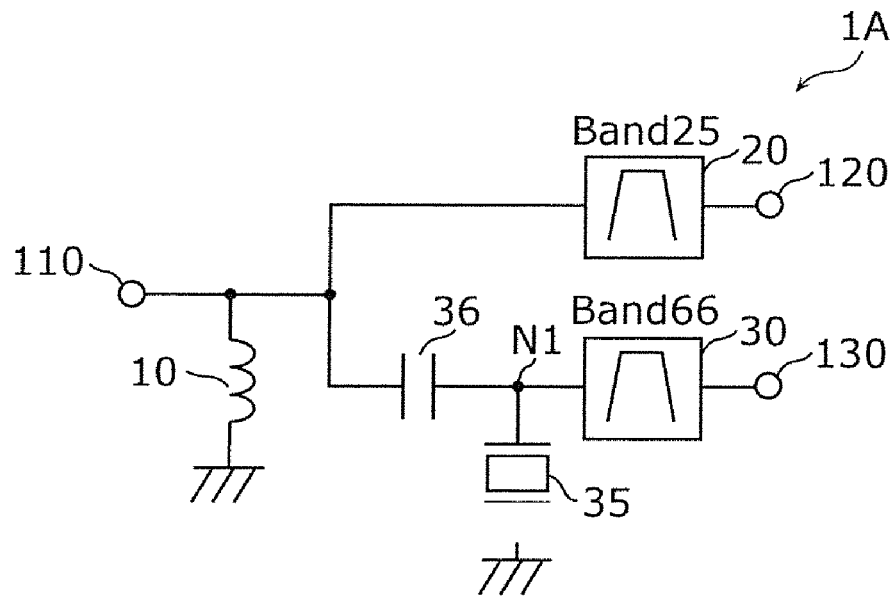
FIG. 6A includes a circuit configuration diagram of the multiplexer according to the modification of the first embodiment and FIG. 6B includes a graph indicating bandpass characteristics of a first filter.
Figure 6B:
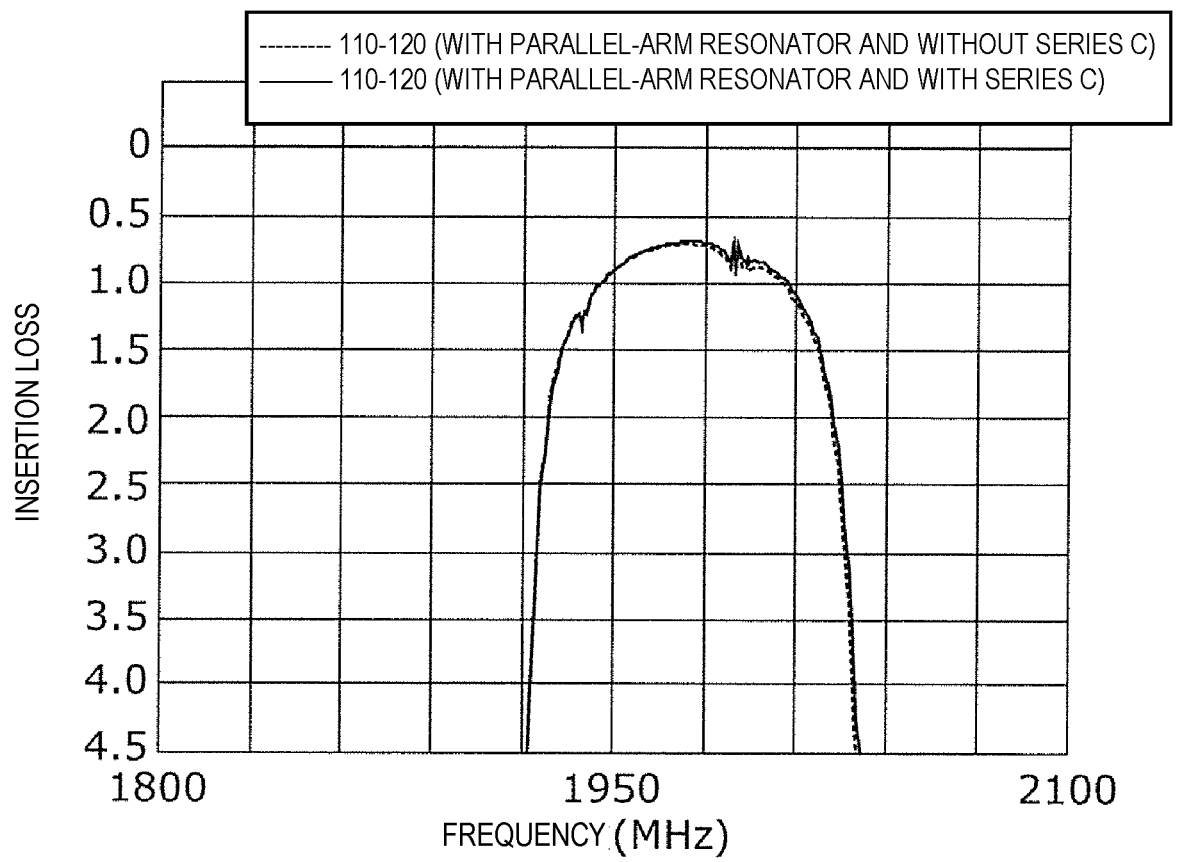

FIG. 6A includes a circuit configuration diagram of the multiplexer 1A according to the modification of the first embodiment and FIG. 6B includes a graph indicating bandpass characteristics of the filter 20. In FIG. 6B, the bandpass characteristics of the filter 20 after matching loss is removed in the case where the parallel-arm resonator 35 is added in parallel to the node N1 and the capacitor 36 is added in series to the node N1 and the bandpass characteristics of the filter 20 after matching loss is removed in the case where the parallel-arm resonator 35 is added in parallel to the node N1 and the capacitor 36 is not added are illustrated. As illustrated in FIG. 6B, the insertion loss of the first pass band of the filter 20 in the case where the parallel-arm resonator 35 is added in parallel to the node N1 and the capacitor 36 is added in series to the node N1 is improved compared to the filter 20 in the case where the parallel-arm resonator 35 is added in parallel and the capacitor 36 is not added.

Thus, by adding the parallel-arm resonator 35 and the capacitor 36, the attenuation band of the filter 30 (the first pass band) is shifted towards the higher impedance side. Thus, the attenuation characteristics of the filter 30 can be improved, and the bandpass characteristics (insertion loss) of the first pass band of the filter 20 can also be improved. That is, optimization of the impedance of the filter 20 that is connected to the common terminal 110 and optimization of the impedance of the filter 30 that is connected to the common terminal 110 can be achieved at the same time, and optimization of the bandpass characteristics (insertion loss) of the filter 20 and optimization of the bandpass characteristics (attenuation characteristics) of the filter 30 can be achieved at the same time.

Second Embodiment

In the first embodiment, optimization of impedances of the filters 20 and 30 is achieved by making the inductive region of the parallel-arm resonator 35 overlap with the pass band of the filter 20. However, in this embodiment, optimization of impedances of the filters 20 and 30 is achieved by making a capacitive region of the parallel-arm resonator 35 overlap with the pass band of the filter 20.

[2.1 Configuration of Multiplexer 1B]

Figure 7A:
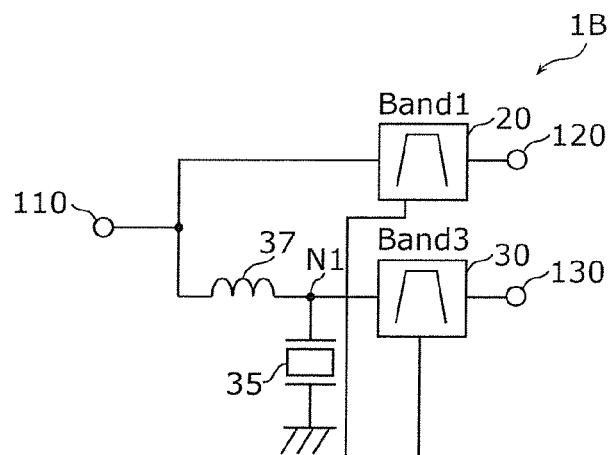
FIG. 7A includes a circuit configuration diagram of a multiplexer according to a second embodiment and FIG. 7B includes a graph indicating impedance characteristics of a parallel-arm resonator.
Figure 7B:
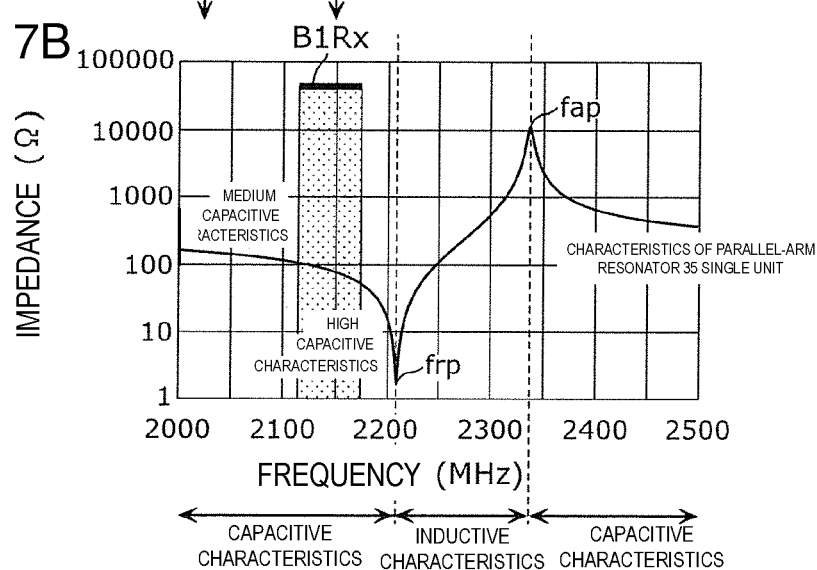

FIG. 7A includes a circuit configuration diagram of a multiplexer 1B according to a second embodiment and FIG. 7B includes impedance characteristics of a parallel-arm resonator 35. As illustrated in FIG. 7A, the multiplexer 1B includes a common terminal 110 (first common terminal), a reception output terminal (first input/output terminal) 120, a reception output terminal (second input/output terminal) 130, filters 20 and 30, the parallel-arm resonator 35, and an inductor 37.

The filter 20 is an example of a first filter. The filter 20 is connected between the common terminal 110 and the reception output terminal 120 and has a first pass band, which is different from pass bands of the filters 30 and 40.

The filter 30 is an example of a second filter. The filter 30 is connected between the common terminal 110 and the reception output terminal 130 and has a second pass band, which is different from pass bands of the filters 20 and 40.

The parallel-arm resonator 35 is an example of an impedance matching circuit that is arranged between the common terminal 110 and the filter 30 and is an acoustic wave resonator that is connected between a node N1 on a path connecting the common terminal 110 to the filter 30 and the ground.

The inductor 37 is an example of a first inductor. The inductor 37 is included in an impedance matching circuit that is arranged between the common terminal 110 and the filters 20 and 30. The inductor 37 is arranged in series between a connection point for the filters 20 and 30 and the node N1.

The filters 20 and 30 are, for example, acoustic wave filters using SAW. However, the filters 20 and 30 may be acoustic wave filters using BAW, LC resonant filters, or dielectric filters.

As illustrated in FIG. 7A, in this embodiment, the filter 20 is, for example, a filter in which LTE Band 1 (reception band: 2110 MHz to 2170 MHz) is used as a first pass band, and the filter 30 is, for example, a filter in which LTE Band 3 (reception band: 1805 MHz to 1880 MHz) is used as a second pass band. In this case, the first pass band of the filter 20 is located on a frequency side higher than the second pass band of the filter 30. With this arrangement, the multiplexer 1B is capable of transmitting a high-frequency reception signal of Band 1 and a high-frequency reception signal of Band 3 at the same time.

[2.2 Impedance Characteristics of Multiplexer 1B]

As illustrated in FIG. 7B, in this embodiment, the parallel-arm resonator 35 has a resonant frequency frp of the minimum impedance and an anti-resonant frequency fap of the maximum impedance. The resonant frequency frp is lower than the anti-resonant frequency fap. In the case where the parallel-arm resonator 35 is an acoustic wave resonator, in a frequency range lower than the resonant frequency frp and a frequency range higher than the anti-resonant frequency fap, the impedance of the parallel-arm resonator 35 exhibits capacitive characteristics. In contrast, in a frequency range higher than the resonant frequency frp and lower than the anti-resonant frequency fap, the impedance of the parallel-arm resonator 35 exhibits inductive characteristics. Furthermore, in the capacitive frequency range that is located on the frequency side lower than the resonant frequency frp, higher capacitive characteristics are obtained at a frequency closer to the resonant frequency frp, and lower capacitive characteristics are obtained at a lower frequency farther away from the resonant frequency frp.

In the multiplexer 1B according to this embodiment, as illustrated in FIG. 7B, the resonant frequency frp of the parallel-arm resonator 35 is located on a frequency side higher than the pass band of the pass band of the filter 20 (in FIG. 7B, B1Rx). Furthermore, the resonant frequency frp of the parallel-arm resonator 35 is in close proximity to the higher frequency end of the pass band of the filter 20 (in FIG. 7B, B1Rx).

Figure 8A:
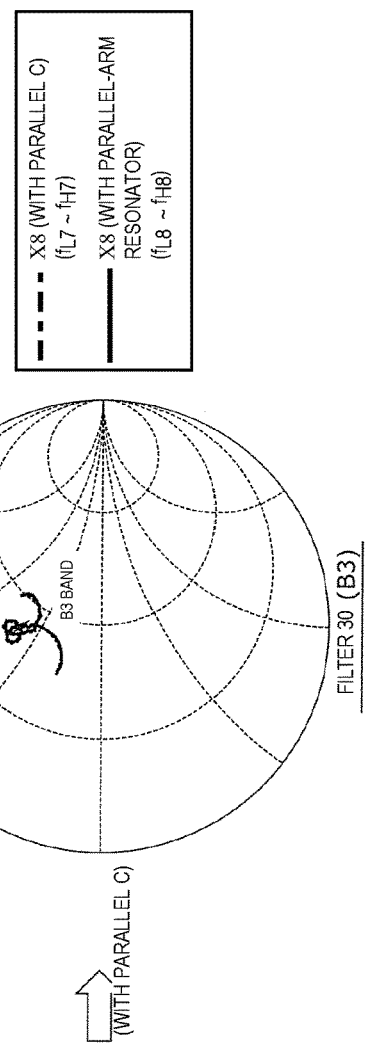
FIG. 8A includes a circuit configuration diagram of the multiplexer according to the second embodiment and FIGS. 8B and 8C include Smith charts indicating impedance characteristics of a second filter.
Figure 8B:
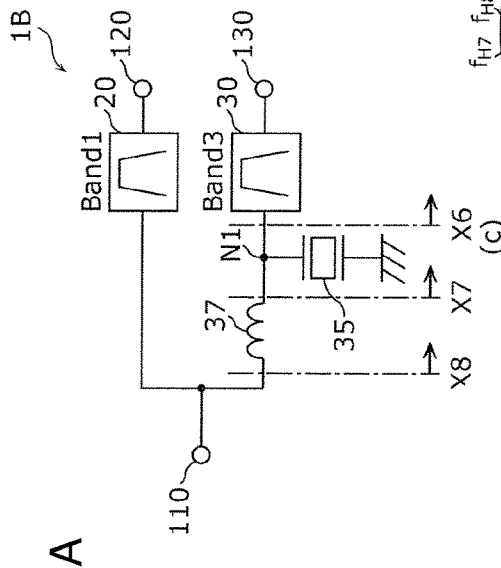
Figure 8C:
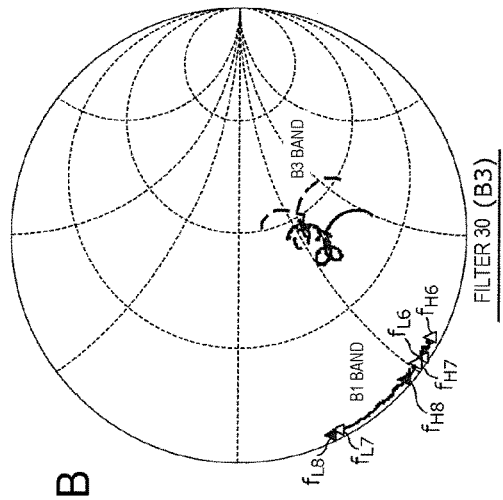

FIG. 8A includes a circuit configuration diagram of the multiplexer 1B according to the second embodiment and FIGS. 8B and 8C include Smith charts indicating impedance characteristics of the filter 30. As illustrated in FIG. 8A, a node on a path between the node N1 to which the parallel-arm resonator 35 is connected and an input end of the filter 30 is represented by a node X6, a node on a path between one end of the inductor 37 and the node N1 is represented by a node X7, and a node on a path between the connection node for the filters 20 and 30 and the other end of the inductor 37 is represented by a node X8. Furthermore, in the Smith charts illustrated in FIGS. 8B and 8C, only the impedance of the second pass band of the filter 30 (vicinity of a reference impedance: in FIGS. 8B and 8C, indicated as B3 band) and the impedance of a predetermined attenuation band of the filter 30 (the first pass band of the filter 20) (vicinity of the outer circumference: in FIGS. 8B and 8C, indicated as B1 band) are illustrated, and illustration of impedances of other bands is omitted.

In FIG. 8B, the impedance of the filter 30 single unit as viewed from the node X6 (rough broken line), the impedance of the filter 30 in the case where a capacitive element is added in parallel in place of the parallel-arm resonator 35 (and the filter 20 is not connected) as viewed from the node X7 (fine broken line), and the impedance of the filter 30 in the case where the parallel-arm resonator 35 is added in parallel (and the filter 20 is not connected) as viewed from the X8 (solid line) are illustrated.

As illustrated in FIG. 7B, the resonant frequency frp of the parallel-arm resonator 35 is located in the vicinity of a higher frequency side of the first pass band of the filter 20. That is, the first pass band of the filter 20 is included in a capacitive region of the parallel-arm resonator 35. Furthermore, the second pass band of the filter 30 is also included in the capacitive region of the parallel-arm resonator 35. Accordingly, as illustrated in FIG. 8B, regarding the impedance characteristics of the filter 30 as viewed from the node X7, by adding the capacitive impedance in parallel, the impedance of the second pass band (B3 band) in the case where the parallel-arm resonator 35 is added and the impedance of the second pass band (B3 band) in the case where the capacitive element is added are shifted in a clockwise direction along the constant conductance circle on the admittance chart by substantially the same amount, compared to the impedance of the second pass band (B3 band) of the filter 30 single unit as viewed from the node X6.

In contrast, regarding the impedance characteristics of the filter 30 as viewed from the node X7 in the case where the capacitive element is added in parallel, by adding the capacitive impedance of the capacitive element in parallel, the impedance of the first pass band (B1 band) ($f_{L7}$ to $f_{H7}$) is shifted in the clockwise direction along the constant conductance circle on the admittance chart, compared to the impedance of the first pass band of the filter 30 single unit as viewed from the node X6 ($f_{L6}$ to $f_{H6}$).

Furthermore, regarding the impedance characteristics of the filter 30 as viewed from the node X7 in the case where the parallel-arm resonator 35 is added in parallel, the impedance of the first pass band (B1 band) ($f_{L8}$ to $f_{H8}$) is significantly shifted towards a short side in the clockwise direction along the constant conductance circle on the admittance chart, compared to the impedance of the first pass band of the filter 30 as viewed from the node X7 in the case where the capacitive element is added in parallel ($f_{L7}$ to $f_{H7}$). More specifically, regarding the impedance characteristics of the filter 30 as viewed from the node X7, as illustrated in FIG. 7B, a capacitive component of the parallel-arm resonator 35 is added in parallel in a lower frequency end of the first pass band (B1 band) and a higher capacitive component of the parallel-arm resonator 35 is added in parallel in a higher frequency end of the first pass band (B1 band). Thus, the impedance of the first pass band (B1 band) of the filter 30 in the case where the parallel-arm resonator 35 is added in parallel is significantly shifted towards the short side in the anticlockwise direction along the constant conductance circuit on the admittance chart without necessarily reducing the reflection coefficient ($f_{L6} \rightarrow f_{L8}$, $f_{H6} \rightarrow f_{H8}$).

Next, as is clear from comparison between FIG. 8B and FIG. 8C, regarding the impedance characteristics of the filter 30 as viewed from the node X8, due to the inductor 37 that is arranged in series between the common terminal 110 and the node N1, by adding the inductive impedance in series, the impedance of the second pass band (B3 band) in the case where the parallel-arm resonator 35 is added and the impedance of the second pass band (B3 band) in the case where the capacitive element is added are shifted in the clockwise direction by the same amount along the constant resistance circle on the Smith chart, compared to the impedance of the filter 30 as viewed from the node X7.

In contrast, regarding the impedance characteristics of the filter 30 as viewed from the node X8, by adding the inductive impedance in series, the impedance of the first pass band (B1 band) ($f_{L8}$ to $f_{H8}$) in the case where the parallel-arm resonator 35 is added and the impedance of the first pass band (B1 band) ($f_{L7}$ to $f_{H7}$) in the case where the capacitive element is added are shifted towards an open side in the clockwise direction along the constant resistance circle on the Smith chart. At this time, as illustrated in FIG. 8C, the impedance of the first pass band (B1 band) ($f_{L8}$ to $f_{H8}$) in the case where the parallel-arm resonator 35 is added is shifted towards the open side relative to the impedance of the first pass band (B1 band) ($f_{L7}$ to $f_{H7}$) in the case where the capacitive element is added in place of the parallel-arm resonator 35, without necessarily reducing the reflection coefficient.

Figure 9A:
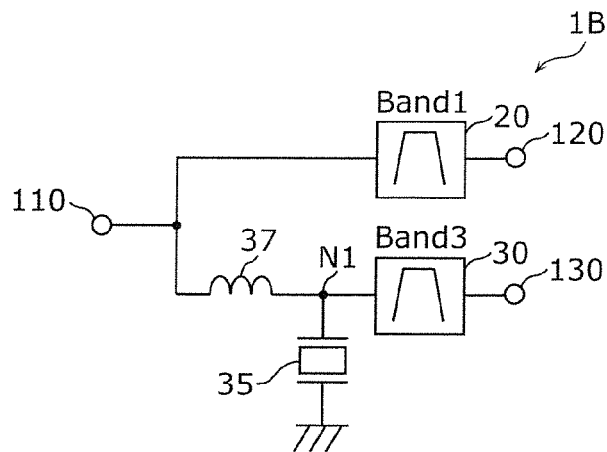
FIG. 9A includes a circuit configuration diagram of the multiplexer according to the second embodiment and FIG. 9B includes a graph indicating bandpass characteristics of a first filter.
Figure 9B:
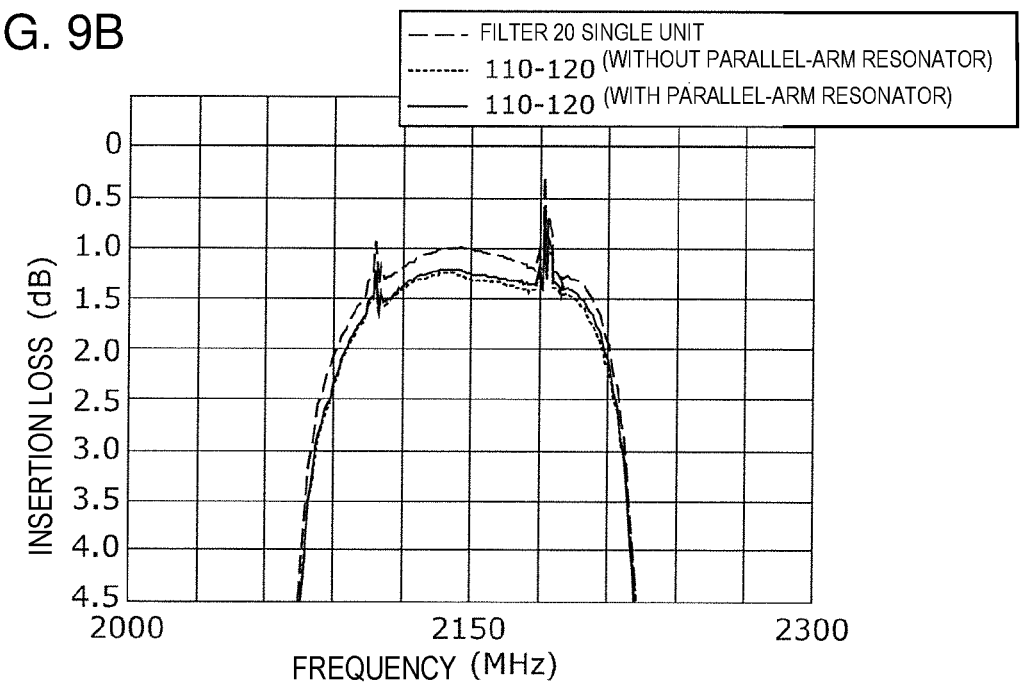

FIG. 9A includes a circuit configuration diagram of the multiplexer 1B according to the second embodiment and FIG. 9B includes a graph indicating bandpass characteristics of the filter 20. As illustrated in FIG. 9B, insertion loss of the first pass band of the filter 20 in the case where the parallel-arm resonator 35 is added is improved compared to the filter 20 in the case where the parallel-arm resonator 35 is not added.

Thus, by adding the parallel-arm resonator 35, the attenuation band of the filter 30 (the first pass band) is shifted towards the higher impedance side. Thus, the attenuation characteristics of the filter 30 can be improved, and the bandpass characteristics (insertion loss) of the first pass band of the filter 20 can also be improved. That is, optimization of the impedance of the filter 20 that is connected to the common terminal 110 and optimization of the impedance of the filter 30 that is connected to the common terminal 110 can be achieved at the same time, and optimization of the bandpass characteristics (insertion loss) of the filter 20 and optimization of the bandpass characteristics (attenuation characteristics) of the filter 30 can be achieved at the same time.

[2.3 Configuration of Multiplexer 1C According to Modification]

Figure 10A:
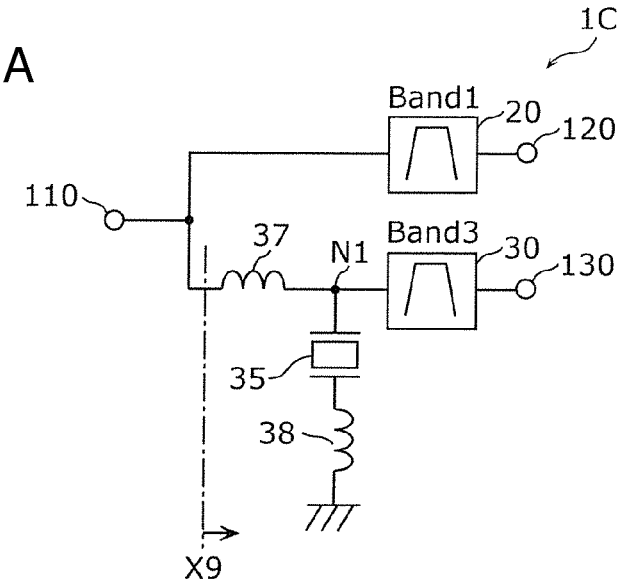
FIG. 10A includes a circuit configuration diagram of a multiplexer according to a modification of the second embodiment and FIG. 10B includes a Smith chart indicating impedance characteristics of a second filter.
Figure 10B:
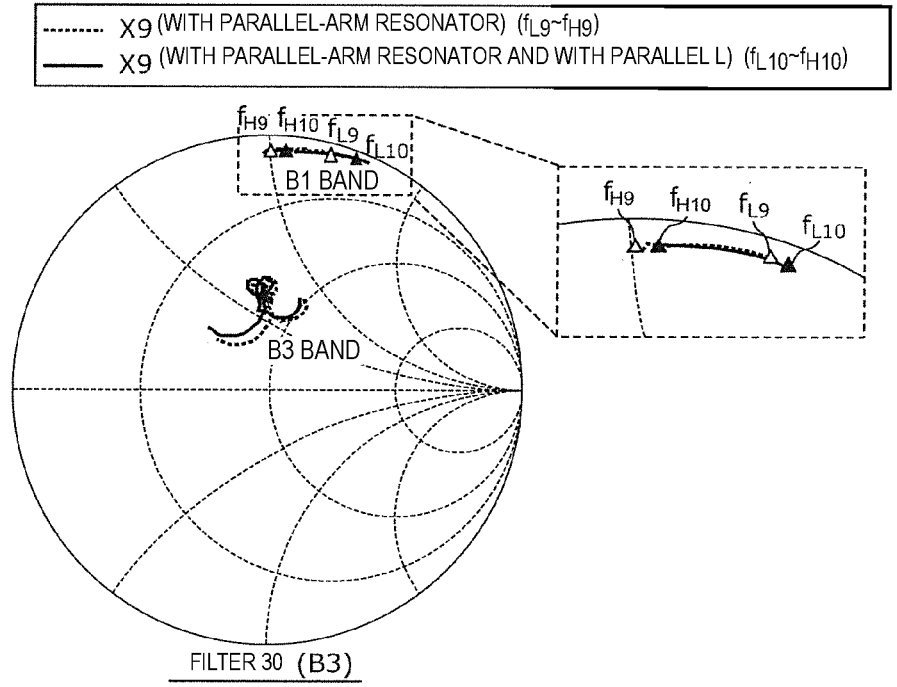

FIG. 10A includes a circuit configuration diagram of a multiplexer 1C according to a modification of the second embodiment and FIG. 10B includes a Smith chart indicating impedance characteristics of the filter 30.

As illustrated in FIG. 10A, the multiplexer 1C includes the common terminal 110, the reception output terminals 120 and 130, the filters 20 and 30, the parallel-arm resonator 35, and inductors 37 and 38. The multiplexer 1C according to this modification is different from the multiplexer 1B according to the second embodiment in that the inductor 38 is added. The multiplexer 1C according to this modification will be described below by focusing on differences from the multiplexer 1B according to the second embodiment and explanation for the same features as those of the multiplexer 1B according to the second embodiment will be omitted.

The inductor 38 is included in an impedance matching circuit that is arranged between the common terminal 110 and the filter 30. The inductor 38 is an example of a second inductor. The inductor 38 is connected to the ground and is connected in series with the parallel-arm resonator 35 between the node N1 and the ground.

[2.4 Impedance Characteristics of Multiplexer 1C According to Modification]

As illustrated in FIG. 10A, a node on a path between the connection node for the filters 20 and 30 and the other end of the inductor 37 is represented by a node X9. Furthermore, in the Smith chart illustrated in FIG. 10B, only the impedance of the second pass band of the filter 30 (vicinity of the reference impedance: in FIG. 10B, indicated as B3 band) and the impedance of a predetermined attenuation band of the filter 30 (the first pass band of the filter 20) (vicinity of the outer circumference: in FIG. 10B, indicated as B1 band) are illustrated, and illustration of impedances of other bands is omitted.

With the above-described arrangement, regarding the impedance characteristics of the filter 30 as viewed from the node X9, due to the series circuit including the parallel-arm resonator 35 and the inductor 38, a high capacitive component is added to the impedance of the first pass band (B1 band), especially on a lower frequency side of the attenuation band (B1 band).

That is, regarding the impedance characteristics of the filter 30 as viewed from the node X9, the impedance of the first pass band (B1 band) ($f_{L10}$ to $f_{H10}$) in the case where the series connection circuit including the parallel-arm resonator 35 and the inductor 38 is added is shifted towards the open side relative to the impedance of the first pass band (B1 band) ($f_{L9}$ to $f_{H9}$) in the case where only the parallel-arm resonator 35 is added, without necessarily reducing the reflection coefficient.

Figure 11A:
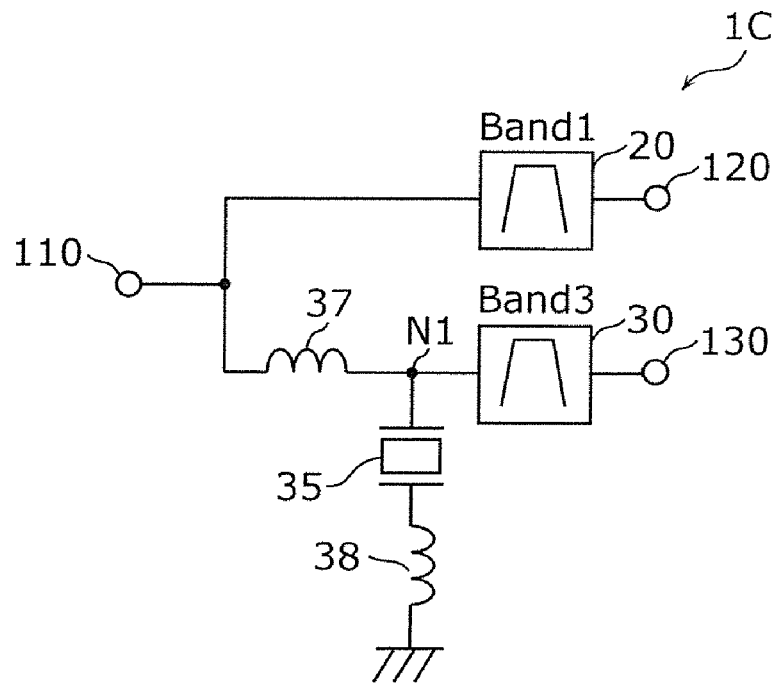
FIG. 11A includes a circuit configuration diagram of the multiplexer according to the modification of the second embodiment and FIG. 11B includes a graph indicating bandpass characteristics of a first filter.
Figure 11B:
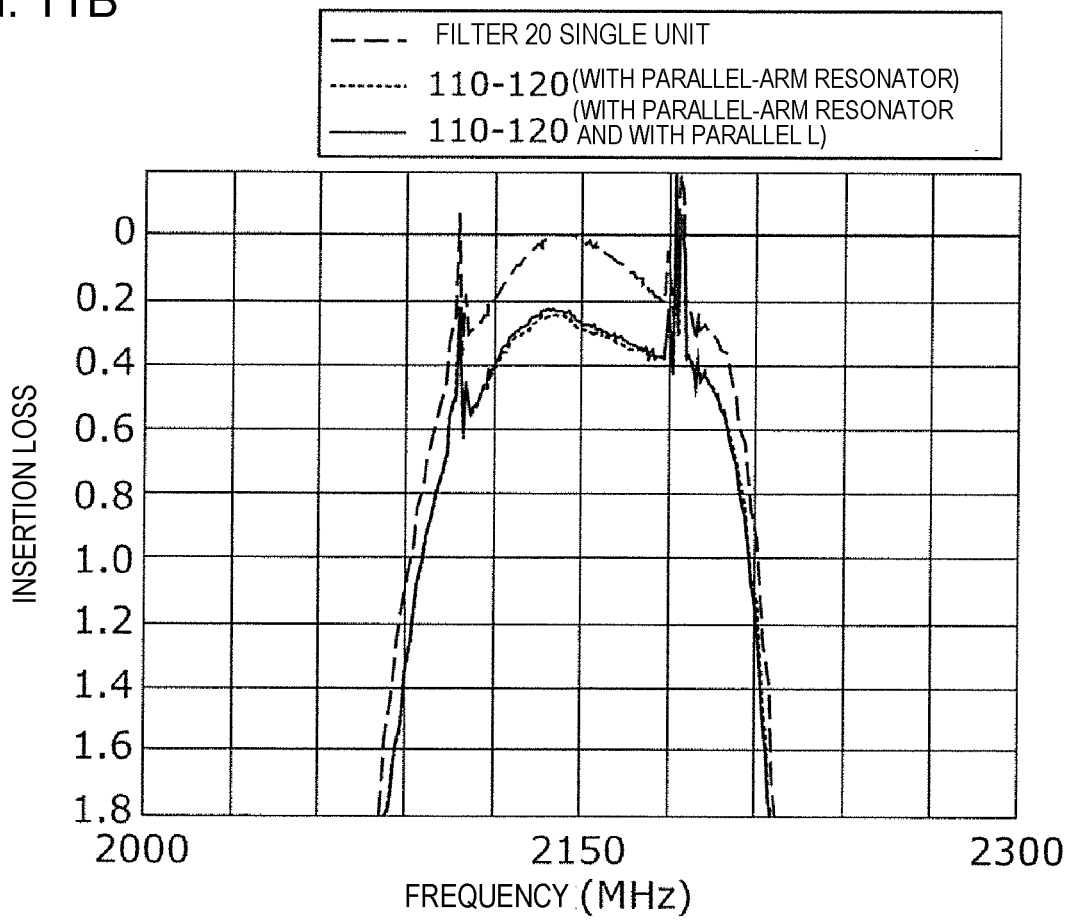

FIG. 11A includes a circuit configuration diagram of the multiplexer 1C according to the modification of the second embodiment and a FIG. 11B includes graph indicating bandpass characteristics of the filter 20. As illustrated in FIG. 11B, insertion loss of the first pass band of the filter 20 in the case where the series connection circuit including the parallel-arm resonator 35 and the inductor 38 is added to the node N1 is improved compared to the filter 20 in the case where only the parallel-arm resonator 35 is added to the node N1.

Thus, by adding the inductor 38, the attenuation band of the filter 30 (the first pass band) is shifted towards the higher impedance side. Thus, the attenuation characteristics of the filter 30 can be improved, and the bandpass characteristics (insertion loss) of the first pass band of the filter 20 can also be improved. That is, optimization of the impedance of the filter 20 that is connected to the common terminal 110 and optimization of the impedance of the filter 30 that is connected to the common terminal 110 can be achieved at the same time, and optimization of the bandpass characteristics (insertion loss) of the filter 20 and optimization of the bandpass characteristics (attenuation characteristics) of the filter 30 can be achieved at the same time.

Other Embodiments

A multiplexer, a front end module, and a communication device according to embodiments and modifications of the present disclosure have been described above. However, the present disclosure is not limited to the embodiments and the modifications described above. Other embodiments implemented by combining any components of the embodiments and the modifications, modifications obtained by making various changes conceived by those skilled in the art to the embodiments and the modifications without necessarily departing from the spirit of the present disclosure, various types of equipment in which a multiplexer, a front end module, and a communication device according to the present disclosure are built are also included in the present disclosure.

Furthermore, for example, in multiplexers, front end modules, and communication devices according to the embodiments and the modifications, a matching element, such as an inductor or a capacitor and a switching circuit may be connected between components. An inductor may be a wiring inductor formed of wiring for connecting components.

INDUSTRIAL APPLICABILITY

The present disclosure may be widely used, as a multiplexer, a front end module, and a communication device that may be used for a multiband system, for communication equipment, such as mobile phones.

REFERENCE SIGNS LIST 1, 1A, 1B, 1C multiplexer
2 antenna
3 RF signal processing circuit (RFIC)
4 baseband signal processing circuit (BBIC)
5 communication device
6 reception amplification circuit
7 front end module
10, 37, 38 inductor
20, 30, 40 filter
35 parallel-arm resonator
36 capacitor
50 switch
50a common terminal
50b, 50c selection terminal
62, 63, 64 low-noise amplifier
110 common terminal
120, 130, 140 reception output terminal
N1, N2, X1, X2, X3, X4, X5, X6, X7, X8, X9 node

The invention claimed is:

1. A multiplexer comprising:
a first common terminal, a first input/output terminal, and a second input/output terminal;
a first filter that is connected between the first common terminal and the first input/output terminal;
a second filter that is connected between the first common terminal and the second input/output terminal, and that has a pass band different from a pass band of the first filter; and
an impedance matching circuit that is arranged between the first common terminal and the second filter,
wherein the impedance matching circuit comprises an acoustic wave resonator that is connected between ground and a node on a path that connects the first common terminal to the second filter, and
wherein a frequency range from a resonant frequency to an anti-resonant frequency of the acoustic wave resonator at least partially overlaps with the pass band of the first filter.

2. The multiplexer according to claim 1, wherein the anti-resonant frequency of the acoustic wave resonator is in the pass band of the first filter.

3. The multiplexer according to claim 1, wherein the frequency range from the resonant frequency to the anti-resonant frequency of the acoustic wave resonator comprises the pass band of the first filter.

4. The multiplexer according to claim 1, wherein the impedance matching circuit further comprises a capacitor that is in series between the first common terminal and the node.

5. The multiplexer according to claim 4, wherein the pass band of the first filter is Band 25 of Long Term Evolution (LTE), and the pass band of the second filter is Band 66 of LTE.

6. The multiplexer according to claim 1,
wherein the pass band of the second filter comprises lower frequencies than the pass band of the first filter,
wherein the impedance matching circuit further comprises a first inductor that is in series between the first common terminal and the node, and
wherein a resonant frequency of the acoustic wave resonator is greater than the pass band of the first filter.

7. The multiplexer according to claim 6, wherein the impedance matching circuit further comprises a second inductor that is in series between the acoustic wave resonator and ground.

8. The multiplexer according to claim 7, wherein the pass band of the first filter is Band 1 of Long Term Evolution (LTE), and the pass band of the second filter is Band 3 of LTE.

9. A front end module comprising:
a third input/output terminal;
a switch that comprises a second common terminal, a first selection terminal, and a second selection terminal, and that is configured to connect the second common terminal to the first selection terminal, and connect the second common terminal to the second selection terminal, at the same time;
the multiplexer according to claim 1, wherein the first common terminal is connected to the first selection terminal; and
a third filter that is connected between the second selection terminal and the third input/output terminal, and that has a pass band different from the pass bands of the first filter and the second filter.

10. A communication device comprising:
a radio frequency (RF) signal processing circuit that is configured to process a high frequency signal that is transmitted or received through an antenna; and
the front end module according to claim 9 that is configured to pass the high frequency signal between the antenna and the RF signal processing circuit.

11. A communication device comprising:
a radio frequency (RF) signal processing circuit that is configured to process a high frequency signal that is transmitted or received through an antenna; and
the multiplexer according to claim 1 that is configured to pass the high frequency signal between the antenna and the RF signal processing circuit.

12. A multiplexer comprising:
a first common terminal, a first input/output terminal, and a second input/output terminal;
a first filter that is connected between the first common terminal and the first input/output terminal;
a second filter that is connected between the first common terminal and the second input/output terminal, and that has a pass band different from a pass band of the first filter; and
an impedance matching circuit that is arranged between the first common terminal and the second filter,
wherein the impedance matching circuit comprises an acoustic wave resonator that is connected between ground and a node on a path that connects the first common terminal to the second filter, and
wherein the pass band of the first filter is Band 25 of Long Term Evolution (LTE), and the pass band of the second filter is Band 66 of LTE.

13. A multiplexer comprising:
a first common terminal, a first input/output terminal, and a second input/output terminal;
a first filter that is connected between the first common terminal and the first input/output terminal;
a second filter that is connected between the first common terminal and the second input/output terminal, and that has a pass band different from a pass band of the first filter; and
an impedance matching circuit that is arranged between the first common terminal and the second filter,
wherein the impedance matching circuit comprises an acoustic wave resonator that is connected between ground and a node on a path that connects the first common terminal to the second filter, and
wherein the pass band of the first filter is Band 1 of Long Term Evolution (LTE), and the pass band of the second filter is Band 3 of LTE.

* * * * *